United States Patent [19]

Hirose

[11] Patent Number: 4,942,615
[45] Date of Patent: Jul. 17, 1990

[54] GATE PROCESSOR ARRANGEMENT FOR SIMULATION PROCESSOR SYSTEM

[75] Inventor: Fumiyasu Hirose, Machida, Japan

[73] Assignee: Fujitsu Limited, Kawasaki, Japan

[21] Appl. No.: 157,958

[22] Filed: Feb. 19, 1988

[30] Foreign Application Priority Data

Feb. 20, 1987 [JP] Japan ............................. 62-037318

[51] Int. Cl.⁵ ........................... G06F 9/44; G01R 31/28
[52] U.S. Cl. .................................. 364/578; 364/200; 364/232.3
[58] Field of Search .................. 364/200, 900, 578; 371/23

[56] References Cited

U.S. PATENT DOCUMENTS

| | | | |
|---|---|---|---|
| 4,527,249 | 7/1985 | Van Brunt | 364/578 |
| 4,669,083 | 5/1987 | Laviron | 364/578 X |
| 4,769,817 | 9/1988 | Krohn et al. | 371/23 |
| 4,775,950 | 10/1988 | Terada et al. | 364/578 |
| 4,782,440 | 11/1988 | Nomizu et al. | 364/578 X |
| 4,787,061 | 11/1988 | Nei et al. | 371/23 X |

FOREIGN PATENT DOCUMENTS 59-003652  1/1984  Japan ............................. 364/578

Primary Examiner—Felix D. Gruber
Attorney, Agent, or Firm—Staas & Halsey

[57] ABSTRACT

A gate processor arrangement for a logic simulation processor system includes a new event buffer memory for storing an event at a timing $t_a$ for a predetermined logic element in a section of a logic network. A fan-out device for holding connection information for the predetermined logic element in the section of the logic network and reading the data of the predetermined logic element precedingly at a timing t is also provided. The input data of the predetermined logic element is changed at a timing "t+1". An evaluation gate buffer memory is provided having a plurality of evaluation gate memory portions able to be connected to the fan-out device and an evaluation device. The arrangement also includes a net status memory for holding net status information corresponding to input data and output data of a predetermined logic element in the section of the logic network; and an evaluation device responsive to the output of the evaluation gate buffer memory for reading the data in the net status memory, generating information for the change of the network status at a timing "t+1", and supplying the generated information to the event transmission network and/or the new event buffer memory.

5 Claims, 9 Drawing Sheets

EVALUATION ORDER IN EVALUATION DEVICE

Fig. 8
(1) READ OPERATION
   (EVALUATING)
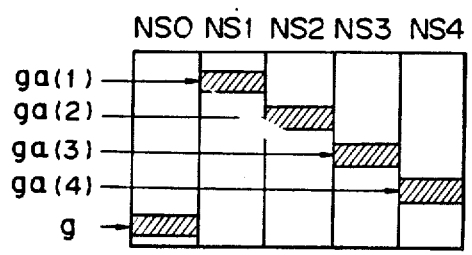
(2) WRITE OPERATION
   (UPDATING)
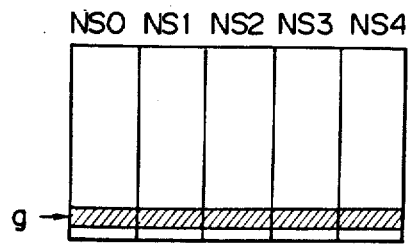

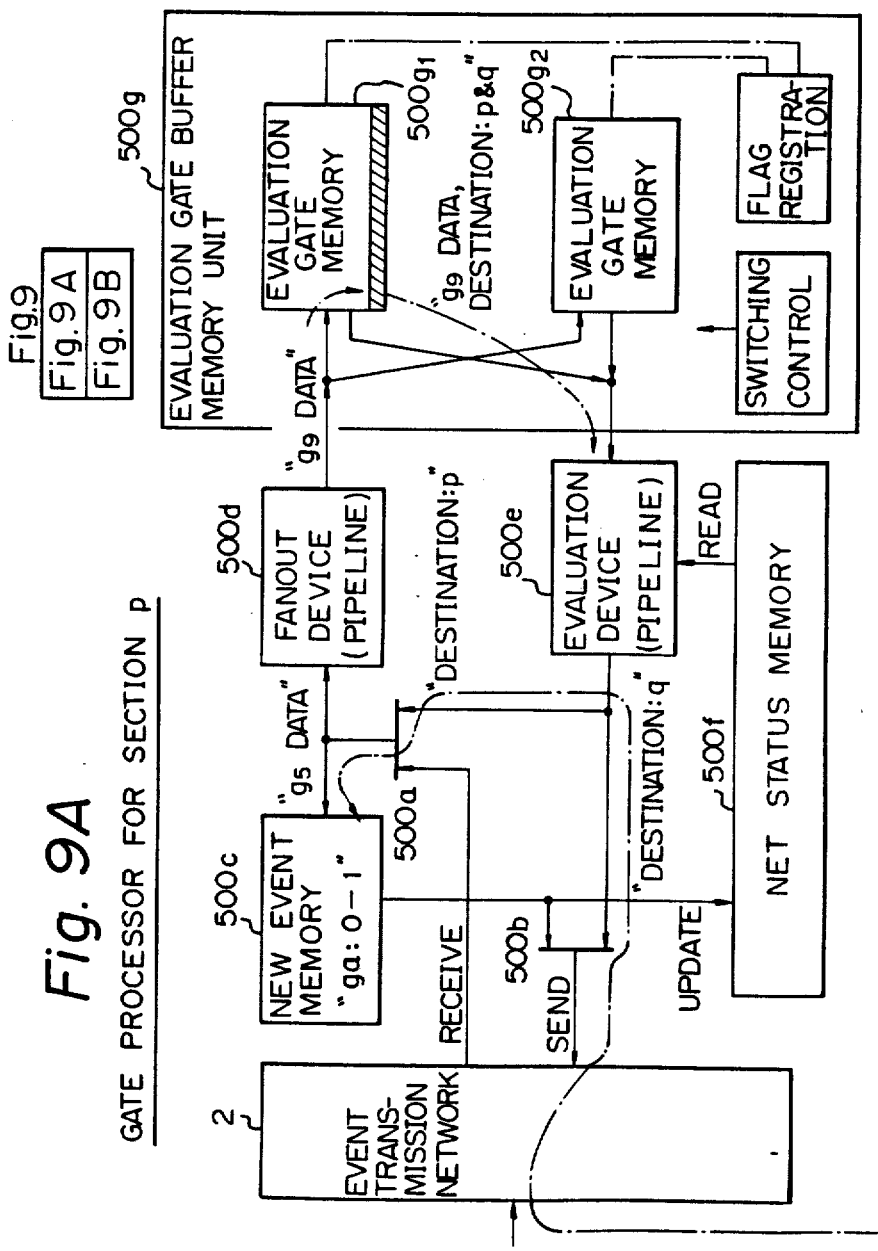

GATE PROCESSOR ARRANGEMENT FOR SIMULATION PROCESSOR SYSTEM

BACKGROUND OF THE INVENTION

1. Field of the Invention

The present invention relates to a gate processor arrangement for a simulation processor (SP) system. The simulation processor system is formed by a control processor, input and output processors, and an event transmission arrangement, and is used for the logic verification of very large scale integrated circuit (VLSICs) before production.

2. Description of the Related Art

In general, in the operation of a gate processor, it is necessary to carry out evaluation processes for evaluating the data of gates in the logic network to be verified, and to carry out inter-processor transmission for transmitting data between gate processors corresponding to sections of the logic network to be verified. First, in the prior art, when a plurality of input data to a gate is simultaneously changed, the evaluations of the same gate are duplicated and such duplicated evaluations reduce the efficiency of the system. Also, in such duplicated evaluations, a pseudo event may occur which will cause a problem in that additional devices and processes are required to deal with such a pseudo event.

Second, in the prior art, when a plurality of fan-outs of a border gate in a logic network section corresponding to a gate processor exist in another logic network section corresponding to another gate processor, a plurality of data transmissions must be carried out. This is true even if this plurality of destination gates are included in the same gate processor. This causes a problem in that a plurality of data transmissions will reduce the efficiency of the system.

Also, when the data transmissions between gate processors occur frequently in a particular later period during one step of the processing, the speed of the processing in the gate processor in question is reduced, causing a delay in the processing. This causes a problem in that such a delay also reduces the efficiency of the system.

Third, in the prior art, it is necessary to perform a double access, i.e., reading and writing, to a net status memory in a gate processor during one machine cycle. This limits the speed of the operation and thus reduces the efficiency of the system.

SUMMARY OF THE INVENTION

An object of the present invention is to provide an improved gate processor arrangement for a logic simulation processor system which will solve the above-described problems.

In accordance with the present invention, there is provided a gate processor arrangement for a logic simulation processor system including a new event buffer memory for storing an event at timing t for a predetermined logic element in a section of a logic network; a fan-out device for holding connection information for the predetermined logic element in the section of the logic network and reading the data of the predetermined logic element preceding the timing t, the input data of the predetermined logic element being changed at a timing "t+1"; and an evaluationn gate buffer memory having a plurality of evaluation gate memory portions connectable to the fan-out device and an evaluation device. The gate processor arrangement also includes a net status memory for holding net status information corresponding to input data and output data of a predetermined logic element in the section of the logic network; and an evaluation device responsive to the output of the evaluation gate buffer memory for reading the data in the net status memory, generating information for a change of the network status at a timing "t+1", and supplying the generated information to the event transmission network and/or the new event buffer memory.

BRIEF DESCRIPTION OF THE DRAWINGS

In the drawings.

FIG. 8 is a table for explaining the operation of the net status memory of FIG. 6; and FIG. 9, including FIGS. 9A and 9B, is a diagram of the gate processor system according to the present invention.

DESCRIPTION OF THE PREFERRED EMBODIMENTS

Before describing a preferred embodiment of the present invention, the prior art arrangement and operation will be described with reference to FIG. 1, FIG. 2, FIG. 3, and FIG. 4.

Figure 1:
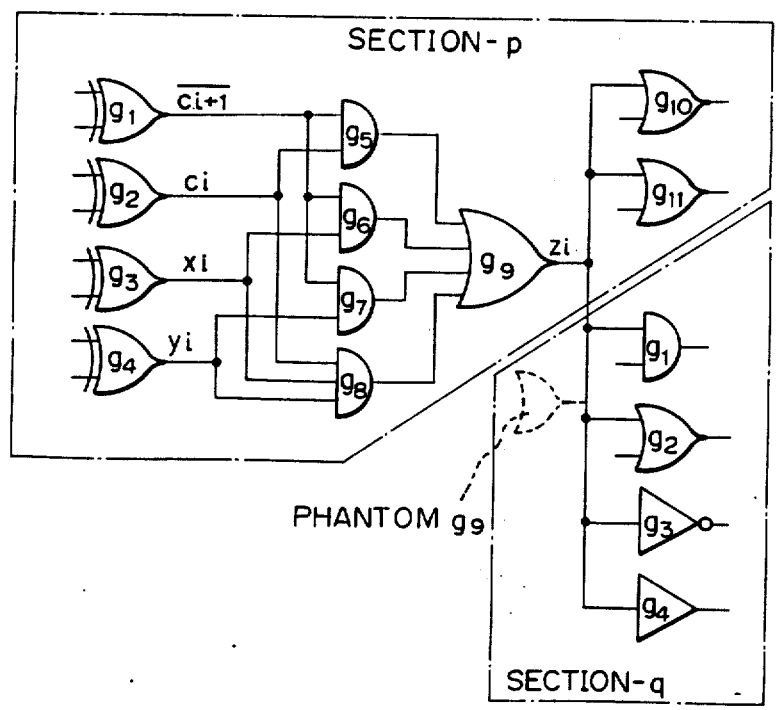
FIG. 1 is a logic network separated into sections for which a logic simulation by a simulation processor system using a gate processor arrangement is to be used.

An example of a logic network separated into sections in a very large scale integrated circuit (VLSI) to which a logic simulation by a simulation processor system using a gate processor arrangement is to be used is shown in FIG. 1. The logic network in a VLSI shown in FIG. 1 is verified by a simulation processor system using a gate processor arrangement.

The logic network is divided into, for example, a section-p and a section-q, as shown in FIG. 1. Section-p includes exclusive OR gates $g_1$, $g_2$, $g_3$, and $g_4$, AND gates $g_5$, $g_6$, $g_7$, and $g_8$, an OR gate $g_9$, and OR gates $g_{10}$, and $g_{11}$, and section-q includes an AND gate $g_1$, an OR gate $g_2$, a NOT gate $g_3$, and a buffer $g_4$. In section-p, gate $g_9$ is considered to be a border gate. In section-p, a phantom $g_9$ gate can be presumed as shown by a broken line. The data Zi from gate $g_9$ in section-p is to be transmitted to several gates in section-q. The exclusive OR gate $g_1$, $g_2$, $g_3$, and $g_4$ deliver carry data $\overline{C_{i+1}}$ and $C_i$, and input data $x_i$ and $y_i$, respectively.

Figure 2:
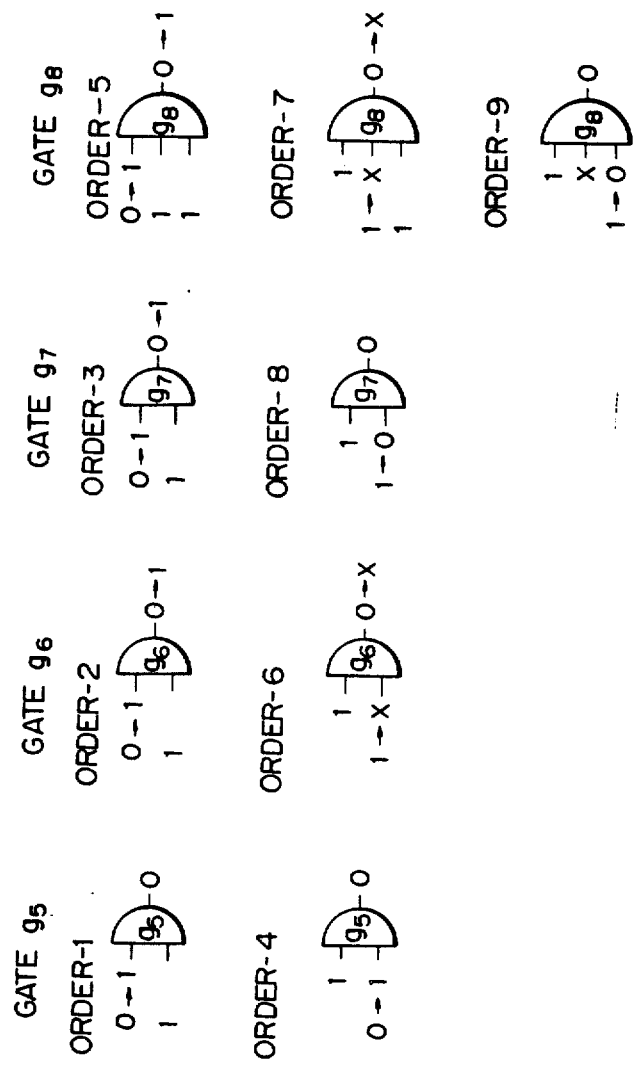
FIG. 2 are logic elements employed in the logic network of FIG. 1.

As an explanation of the evaluation process, an example of changes of the input-output data of the gates $g_5$ to $g_8$ in section-p of the network shown in FIG. 1 is illustrated in FIG. 2, ORDER-1 to ORDER-9 indicate the order in which data from the gates passes through the evaluation device in the gate processor.

In FIG. 2, it cane be seen that when a plurality of inputs to a gate are changed duplicate evaluations must be carried out for a single gate. Also, it can be seen that, in ORDER-5, ORDER-7, and ORDER-8 of gate $g_8$, the output of gate $g_8$ is not changed due to a sequence of changes of the input data. In the intermediate ORDER-5 and ORDER-7, however, the output data is changed, and thus pseudo events occur.

Figure 3:
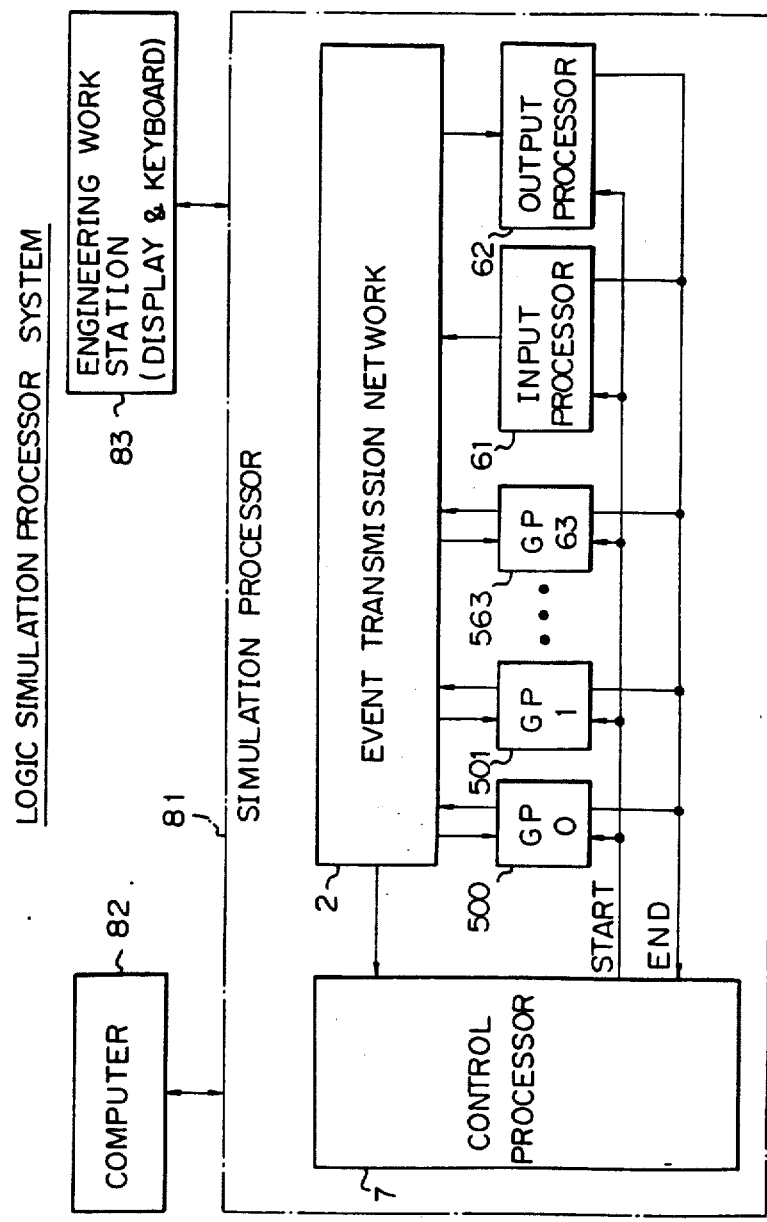
FIG. 3 is a logic simulation processor system to which a gate processor arrangement according to the present invention, can be applied; qp

A logic simulation processor system to which a gate processor arrangement is applied is shown in FIG. 3. The logic simulation processor system is constructed from a simulation processor 81, a computer 82, and an engineering work station (display and keyboard). The simulation processor includes a control processor 7, an event transmission network 2, gate processors 500, 501, ... 563, an input processor 61, and an output processor 62. The gate processors 500, 501, ... 563 correpond to sections of the logic network, respectively. The structure and operation of the event transmission network is explained in detail, for example, in a copending U.S. patent application Ser. No. 142,948 filed on January 12, 1988, based on Japanese Patent Application Nos. 62-4522 and 62-4523.

Figure 4:
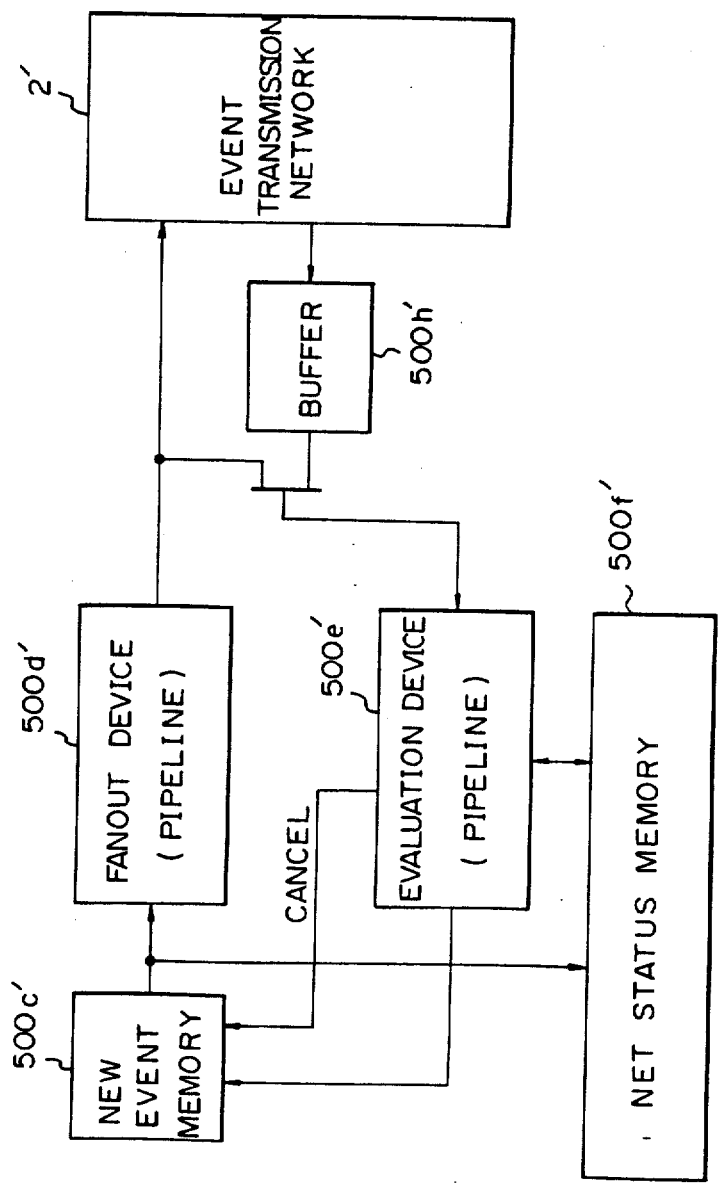
FIG. 4 is a prior art gate processor.

An example of the prior art gate processor is shown in FIG. 4. The gate processor of FIG. 4 is formed by an event transmission network 2', buffer 500$h'$, a new event memory 500$c'$, a fan-out device 500$d'$ in the form of pipeline, an evaluation device 500$e'$ in the form of pipeline, and a net status memory 500$f'$.

In the gate processor of FIG. 4, the net status memory 500$f'$ stores information of the status of each of the gates as logic units in the section of the logic network corresponding to the present gate processor. The new event memory 500$c'$ stores the event information for the gate having an output which is changed at a timing t, based on the result of an evaluation carried out in the evaluation device 500$e'$ at a timing "t−1". The buffer 500$h'$ holds the information received from other gate processors. The fan-out device 500$d'$ holds the information regarding which gate input is changed in correspondence with the change of an event supplied from the new event memory 500$c'$, on the basis of stored information regarding the connection of the gates in the section of the logic network. The evaluation device 500$e'$ receives the information from the gate which has undergone an input change as extracted by the fan-out device 500$d'$, receives information from the desired gate from the net status memory 500$f'$, and decides the output value of the gate which has undergone an input change. The decided output value is supplied to the new event memory 500$c'$.

Figure 5:
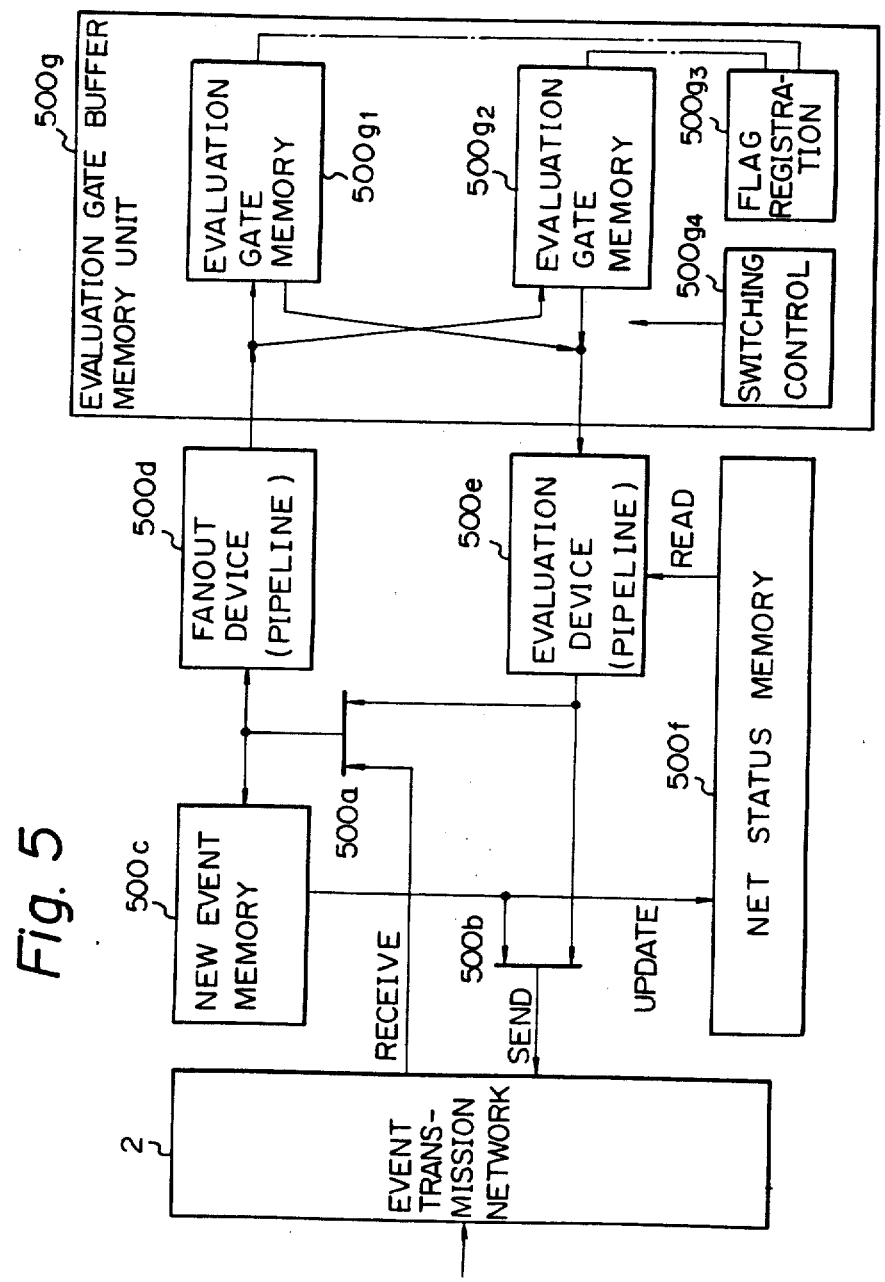
FIG. 5 is a gate processor system for a logic simulation processor system according to an embodiment of the present invention.

A gate processor system for a logic simulation processor system according to an embodiment of the present invention is shown in FIG. 5. In FIG. 5, a single gate processor in a gate processor system is shown.

The gate processor of FIG. 5 includes OR gates 500$a$ and 500$b$, a new event memory 500$c$, a fan-out device (pipeline type) 500$d$, an evaluation device (pipeline type) 500$e$, a net status memory 500$f$, and an evaluation gate buffer memory unit 500$g$. The evaluation gate buffer memory unit 500$g$ includes evaluation gate memories 500$g_1$ and 500$g_2$. An event transmission network 2 is provided as an inter-processor transmission means. The output of the evaluation device 500$e$ is supplied through the OR gate 500$b$ to the event transmission network 2.

The connections between the fan-out device 500$d$ and the evaluation device 500$e$, and the evaluation gate memories 500$g_1$ and 500$g_2$ in the evaluation gate buffer memory unit 500$g$ are changed by a switching control device 500$g_4$. A flag registration device 500$g_3$ operates in association with evaluation gate memories 500$g_1$ and 500$g_2$.

The evaluation gate memories 500$g_1$ and 500$g_2$ operate as follows. At a timing t from a control processor, the data of a gate having an input which is changed at a timing "t+1" from the fan-out device 500$d$ is received by the evaluation gate memory 500$g_1$, and the data from a gate having the input which is changed at a timing t is output from the evaluation gate memory 500$g_2$ to the evaluation device 500$e$.

At the next timing "t+1", the connections between the fan-out device 500$d$ and the evaluation device 500$e$, and the evaluation gate memories 500$g_1$ and 500$g_2$ are switched. The data of a gate having an input which is changed at a timing "t+1" is output from the evaluation gate memory 500$g_1$ to the evaluation device 500$e$. The data of a gate having an input which is changed at a timing "t+2" from the fan-out device 500$d$ is input to the evaluation gate memory 500$g_2$/which becomes vacant during the preceding timing.

In each of the evaluation gate memories 500$g_1$ and 500$g_2$, when the data in question is the data of a border gate or internal/border gates, data from the maximum address of the evaluation gate memories is stored, and when the data in question is the data of an internal gate only, data from the minimum address of the evaluation gate memory is stored. Thus, the classification of the gates and the storage of the data of the classified gates into the evaluation gate memory are carried out.

When data is stored in an address of the evaluation gate memory corresponding to the gate in question, a flag is registered for this address so that further data cannot be stored in this address. Accordingly, a duplicate evaluation will not occur. Where the data for gates stored in the evaluation gate memory are read, the corresponding flag is changed to 0 so that all of the flags are cleared when the reading is terminated.

Figure 6:
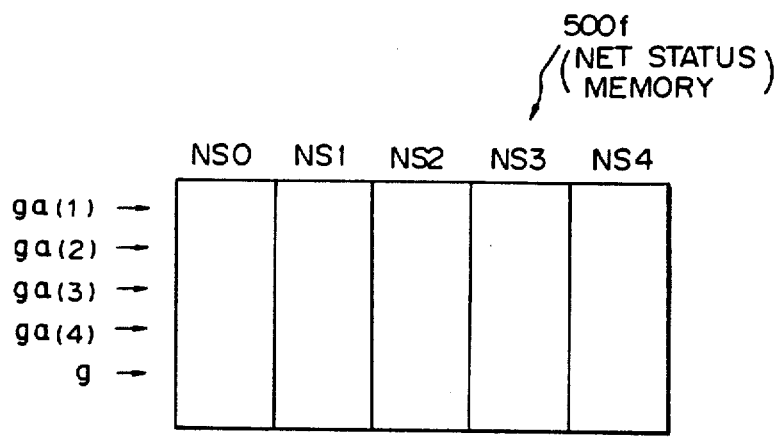
FIG. 6 is a net status memory in the gate processor system of FIG. 5.

The net status memory 500$f$ is updated at the beginning of the operation period, and the evaluation device 500$e$ reads only the input and output data of the gates. The evaluation device 500$e$ is constructed to perform a simultaneous access operation to the output of the gate and to the input of the gate.

an example of the structure of the net status memory 500$f$ in FIG. 5 is shown in FIG. 6. The net status memory is formed by the memory divisions NS0, NS1, NS2, NS3, and NS4 having the same memory content. The contents of the memory divisions NS0, NS1, ... NS4 can be read by the gates g, $g_a(1)$, $g_a(2)$, $g_a(3)$, and $g_a(4)$, respectively.

Figure 7:
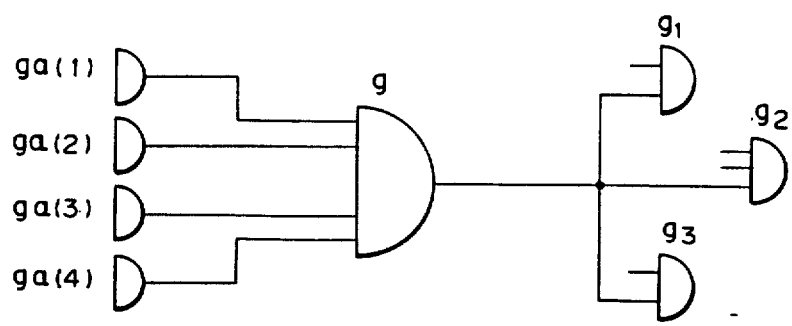
FIG. 7 is an arrangement of logic elements for explaining the operation of the net status memory of FIG. 6.

An example of an arrangement of gates is shown in FIG. 7. The operation of the net status memory 500$f$ with respect to the arrangement of FIG. 7 is illustrated in FIG. 8. During the read operation, access is performed simultaneously by different addresses to read data. During the write operation, i.e., update operation, only a single address need be updated. In the operation illustrated in FIG. 8, either a read operation or a write operation is carried out during one operation cycle.

an example of the operation of the gate processor system according to the present invention will be described. It is presumed that a first one of the gate processors is assigned to section-p of the network in FIG. 1 and another one of the gate processors is assigned to section-q of the network in FIG. 1. The data of the gate having inputs which are changed at a timing "t−1" are evaluated by the evaluation device 500e of the first gate processor.

As a result, changes in the data from 0 to 1 in gate $g_1$, 0 to 1 in gate $g_2$, 1 to X in gate $g_3$, and 1 to 0 in gate $g_4$ are acknowledged. X represents an unknown data which cannot be determined whether it is either 0 or 1. These changes are stored in the new event memory 500c and output to the fan-out device 500d. The data of gates having input signals changed at a timing t are output from the fan-out device 500d and registered in the evaluation gate buffer memory unit 500g.

It is presumed that the evaluation gate memory $500g_1$ is connected to the evaluation device 500e and the evaluation gate memory $500g_2$ is connected to the fan-out device 500d. The data sequence, i.e., $g_5$ data, $g_6$ data, $g_7$ data, $g_5$ data, $g_8$ data, $g_6$ data, $g_8$ data, $g_7$ data, and $g_8$ data, is output to the evaluation gate memory. In this sequence, the data sequence, i.e., $g_5$ data, $g_6$ data, $g_7$ data, $g_8$ data, is stored in the evaluation gate memory $500g_2$, but second data, i.e., the second $g_5$ data, the second $g_6$ the second $g_8$ data, the second $g_7$ data, and the second $g_8$ data, is not stored in the evaluation gate memory $500g_2$ so as to duplicate registration of data.

When the processing of the evaluation device 500e for all of the gate processors and transmission are terminated, the timing becomes the timing t. The fan-out device 500d may be still in operation at the timing t.

At the timing t, the net status memory 500f is updated by the new event memory 500c. If the event observation flag is established for any of the gates $g_1$ to $g_4$, the gate number data, the gate processor number data p (of the gate processor in question), the event observation flag ON data, and the new/old values are transmitted from the new event memory 500c to outside the gate processor and are supplied to an event observation processor.

The observation flag for the gate event is held locally in the evaluation device 500e, and thus, the data 0, 0, 1, and 1 of the gates $g_1$, $g_2$, $g_3$, and $g_4$ are updated to 1, 1, X, and 0.

When the updating and the fan-out operations are terminated, and when the $g_5$ data, $g_6$ data, $g_7$ data, and $g_8$ data are registered in the evaluation gate memory $500g_2$, switching between the evaluation gate memory $500g_1$ and the evaluation gate memory $500g_2$ takes place. The evaluation gate memory $500g_2$ supplies the $g_5$ data, $g_6$ data, $g_7$ data, and $g_8$ data to the evaluation device 500e. The data from a gate stored in the evaluation gate buffer memory unit 500g includes the gate number, the processor number, and the transmission mode. The transmission mode represents one of the internal gate mode, the border gate mode, and the internal/border gate mode. When the mode of the border gate is valid, the processor number represents the transmission destination processor number. In the above-described operations, all of the gates $g_5$ to $g_8$ are internal gates, and thus, the preceding processing for the border gates does not occur.

In the evaluation operation, it is acknowledged that the change from 0 to 1 of the $g_5$ data and the change of 0 to X of the $g_6$ data take place at a timing "t+1". These changes are registered in the new event memory 500c. The fan-out device 500d then registers the $g_9$ data in the evaluation gate memory 500g.

In this case, the transmission mode for $g_9$ is the internal/border gate mode, and the processor number is q. If there are n destination processors $q_1, q_2, \ldots q_n$, the $g_9$ data is delivered n times from the fan-out device 500d, but only at the first delivery is the mode the internal/border gate mode and the processor number $q_1$. In the second to the n-th times, the mode is the border gate mode, and the processor number is $q_i$, where i is 2, 3, . . . n.

According to the duplicate registration prevention arrangement, where the arrangement for gate $g_1$ is registered, the arrangement for gates $g_2$ to $g_n$ is also registered. When gate $g_1$ is excluded by the duplicate registration prevention function, the gates $g_2$ to $g_n$ are also excluded by the duplicate registration prevention function.

When the evaluation of all of the gate processors and transmissions are terminated, the time becomes the timing "t+1". At the timing "t+1", the $g_5$ data and $g_6$ data are updated from 0 and 0 to 1 and X.

After the updating and the fan-out operations are terminated, the switching between the evaluation gate memory $500g_1$ and the evaluation gate memory $500g_2$ takes place. The $g_9$ data is supplied to the evaluation device 500e. This is because the mode is the internal/border gate mode.

Even if there is data of many of the other internal gates registered in the evaluation gate buffer memory unit 500g, the $g_9$ data is first read and processed. When the change of $g_9$ data from 0 to 1 is acknowledged the evaluation device 500e registers the change in the $g_9$ data in the new event memory 500c, sends a request to the fan-out device 500d, and transmits the data externally. If the device is in a border gate mode, only an extreme transmission takes place.

Where a transmission to the gate processor for section-p exists, the data is registered in the new event memory 500c and a request for a read operation by the fan-out device is carried out when the evaluation device 500e does not cause a registration to the new event memory 500c. That is, except when an event occurs in the internal gate mode or the internal/border gate mode, does data become registered in the new event memory 500c.

Figure 9B:
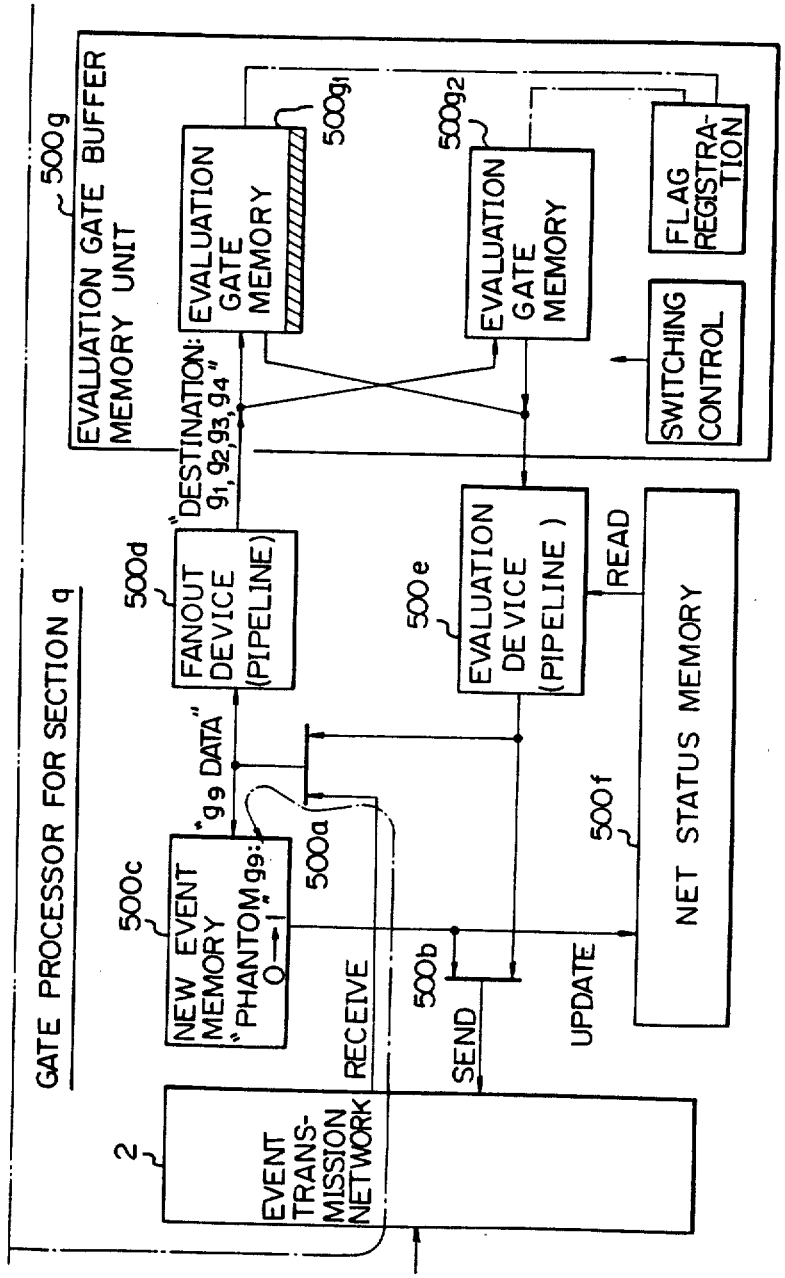

An example of the operation of the gate processor system, including the gate processor for the logic network section-p and the gate processor for the logic network section-q, according to the present invention is illustrated in FIG. 9.

First, $g_5$ data is supplied to the fan-out device 500d of the present gate processor for section-p. The fan-out device 500d delivers the information $g_9$. The data $g_9$ has two destinations: section-p and section-q. The information $g_9$ is stored in the maximum address side of the evaluation gate memory 500g.

The $g_9$ data having as destinations section-p and section-q is input to the evaluation device 500e. The $g_9$ data with the destination section-p is output from the evaluation device 500e through the OR gate 500a and input to the new event memory 500c. Accordingly, the change in the $g_9$ data from 0 to 1 is stored in the new event memory 500c. The $g_9$ data having as a destination the section-q is output from the evaluation device 500e through the OR gate 500b and the event transmisstion network 2 to the gate processor for section-q.

In the gate processor for section-q, the $g_9$ data having as a destination section-q is output from the present gate processor through the event transmission network 2 and the OR gate 500a to the new event memory 500c. Accordingly, the change in phantom $g_9$ data from 0 to 1 is stored in the new event memory 500c. The $g_9$ data is also ouptut to the fan-out device 500d, which delivers an output representing a destination of $g_1$, $g_2$, $g_3$, and $g_4$.

I claim:

1. A gate processor arrangement for a logic simulation processor system including a control processor providing timing signals, input and output processors, and an event transmission network, said gate processor system comprising:

a logic network including logic elements divided into sections for receiving input data and outputting connection information;

a new event buffer memory, corresponding to said logic network, for storing an event at a timing t from the control processor for a predetermined one of said logic elements in one of the sections of said logic network;

a fan-out device, coupled to said new event buffer memory, for holding connection information for said one of said predetermined logic elements in said logic network and reading the data of said predetermined one of said logic elements preceding the timing t, the input data of said predetermined one of said logic elements being changed at a timing "t+1";

an evaluation gate buffer memory, coupled to said fan-out device, having a plurality of evaluation gate memory portions connectable to said fan-out device;

a net status memory, coupled to the logic network and said new event buffer memory, for holding net status information corresponding to input data and output data of a predetermined one of said logic elements in said logic network; and an evaluation device, operatively connected to said evaluation gate buffer memory and said net status memory, responsive to the output of said evaluation gate buffer memory for reading the data in said net status memory, generating information for a change of the logic network status at a timing "t+1", and supplying the generated information to one of the event transmission network and said new event buffer.

2. A gate processor arrangement according to claim 1, wherein said evaluation gate buffer memory holds information from said fan-out device without duplicating the receipt of information for a predetermined one of said logic elements, said fan-out device outputting a plurality of changeable input signals when a plurality of input signals to be input to said logic element are simultaneously changed.

3. A gate processor arrangement according to claim 1, further comprising border gates and internal gates operatively connected to said border gates, wherein said evaluation gate buffer memory receives information for said predetermined logic element from said fan-out device, and delivers information to one of said border gates and internal gates.

4. A gate processor system for a logic simulation processor system including a control processor, and input and output processors, and a logic network including logic elements divided into sections, said gate processor system comprising:

an event transmission network provided as an interprocessor transmission means;

first and second OR gates connected to said event transmission network;

a new event memory operatively connected to said first OR gate, for storing an event at a timing t for a predetermined logic element in a section of the logic network;

a fan-out device, coupled to said new event memory and to said second OR gate, for holding connection information for one of the predetermined logic elements in the logic network and reading the data of the predetermined one of the logic elements preceding the timing t, the input data of the predetermined logic element being changed at a timing "t+1";

an evaluation gate buffer memory connected to said fan-out device, having a plurality of evaluation gate memory portions connectable to said fan-out device;

a net status memory, connected to said new event memory and an input of said first OR gate, for holding net status information corresponding to input data and output data of a predetermined one of the logic elements in the logic network;

an evaluation device, operatively connected to receive an output from said evaluation gate buffer memory and an output from said net status memory and having an output operatively connected to inputs of said first and second OR gates, responsive to the output of said evaluation gate buffer memory for reading the data in said net status memory, generating information for a change of the logic network status at a timing "t+1", and supplying the generated information to said event transmission network and said new event memory through said first and second OR gates, respectively; and switching control means, connectable to said fan-out device, said evaluation device and said evaluation gate memory portions in said evaluation gate buffer memory, for switching the connections between said fan-out device and said evaluation device and said evaluation gate buffer memory portions.

5. A gate processor arrangement according to claim 4, wherein said evaluation gate buffer memory further comprises a flag registration device connected to said evaluation gate memory portions.

* * * * *